United States Patent [19]

Soclof

[11] Patent Number: 4,580,331
[45] Date of Patent: * Apr. 8, 1986

[54] PNP-TYPE LATERAL TRANSISTOR WITH MINIMAL SUBSTRATE OPERATION INTERFERENCE AND METHOD FOR PRODUCING SAME

[75] Inventor: Sidney I. Soclof, San Gabriel, Calif.

[73] Assignee: Rockwell International Corporation, El Segundo, Calif.

[*] Notice: The portion of the term of this patent subsequent to Mar. 20, 2001 has been disclaimed.

[21] Appl. No.: 558,072

[22] Filed: Dec. 5, 1983

Related U.S. Application Data

[63] Continuation-in-part of Ser. No. 279,482, Jul. 1, 1981.

[51] Int. Cl.[4] .................. H01L 21/22; H01L 21/76
[52] U.S. Cl. .................. 29/580; 29/576 W; 29/578; 29/579; 148/1.5; 148/187; 357/35; 357/50; 156/643; 156/648
[58] Field of Search ............. 29/577 R, 576 W, 578, 29/580, 571, 579; 148/187, 1.5, 175, 190; 357/35, 50, 20; 156/643, 648, 653

[56] References Cited

U.S. PATENT DOCUMENTS 4,437,226  3/1984  Soclof .................. 29/580 X
4,466,180  8/1984  Soclof .................. 29/578 X Primary Examiner—Brian E. Hearn
Assistant Examiner—David A. Hey
Attorney, Agent, or Firm—H. Fredrick Hamann; Wilfred G. Caldwell

[57] ABSTRACT

The invention provides a unique VLSI dimensioned PNP-type transistor and method of making the same wherein hundreds of such transistors may be fabricated on a single chip with each transistor comprising an active region surrounded by field oxide completely isolating it from the substrate and its effects on operation. Slots made in the substrate permit angle evaporation of etch-resist to protect the active region while it is disconnected from the substrate by etching therebeneath via the slots. Substrate oxidation supports the active regions while orthogonal slots are provided permitting access to opposed sides of the active regions for doping N+ which is driven in from one side only while P or P+ is introduced and driven in from both sides, thereby providing a P+ N+N, P+ emitter, base, collector transistor active region to which electrical connections are applied using conventional techniques, providing almost complete reduction of the parasitic capacitances and resistances because of the total oxide isolation of the active regions from the substrate.

3 Claims, 14 Drawing Figures 4,580,331

PNP-TYPE LATERAL TRANSISTOR WITH MINIMAL SUBSTRATE OPERATION INTERFERENCE AND METHOD FOR PRODUCING SAME

CROSS-REFERENCE TO RELATED APPLICATIONS

This application is a continuation-in-part of U.S. patent application Ser. No. 279,482 filed July 1, 1981.

FIELD OF THE INVENTION

This invention is a novel structure and method for forming a VLSI PNP type lateral dielectrically isolated transistor utilizing VLSI chip processing steps to fabricate hundreds of such devices simultaneously.

BACKGROUND OF THE INVENTION

Techniques extracted from the prior art come from the field of VLSI fabrication technology wherein the dimensional resolution is now comparable to or even smaller than the thicknesses of the thermally grown silicon oxide layers on silicon. From these techniques, the novel structure and method for the NPN lateral transistor with greatly reduced parasitic capacitance and resistances is achieved.

SUMMARY OF THE INVENTION

The invention is a novel lateral PNP type transistor formed on a substrate by orthogonal slots which define each active region and permit doping of the active regions via opposed slots while supported by oxidation achieved through underlying etching of each active region in a semi-array of regions supported at spaced apart positions and totally isolated from the substrate by substrate oxidation. Electrical connections are conventionally made to the P emitter, N+N base and P collector.

DETAILED DESCRIPTION OF A PREFERRED EMBODIMENT

In the device produced in accordance with the present invention, the effects of the substrate are minimized relative to the operation of the device. It should be realized that the active region may be completely contained with the surface of area of $3d \times 5d$ or $15d^2$ wherein d is only a few micrometers or less. The isolated region is completely separated from the substrate by oxidation and the parasitic capacitances and resistances are almost completely reduced to a minimum value attainable because the transistor is reduced essentially to just its electronically active region whereas in the conventional (vertical) transistor, the electrically active region is only a very small fraction of the total transistor area. The dielectric isolation between transistors offered by the same substrate oxidation has advantages with respect to high frequency performance, high voltage integrated circuits, radiation resistance, circuit flexibility, i.e., the process can provide NPN, PNP, JFET, MOSFET's etc. on the same integrated circuit chip.

Figure 1:
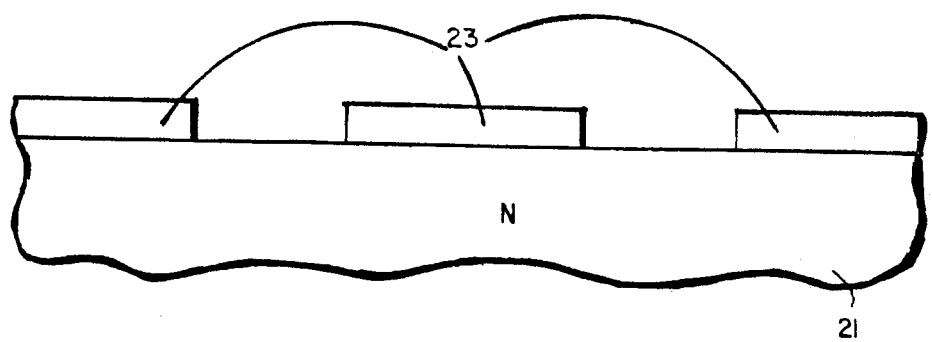
FIG. 1 is a view in section through an N type substrate with photoresist applied through a slotted mask.
Figure 2:
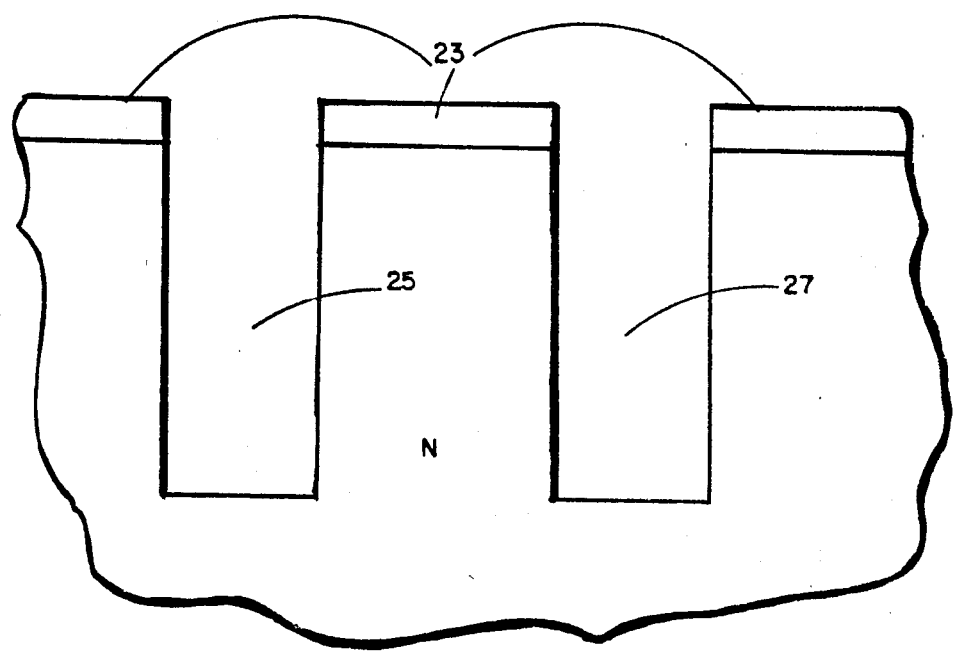
FIG. 2 shows the structure of FIG. 1 with slots formed in the substrate where not protected by the resist.

In FIG. 1 there is shown a silicon substrate of the N type, having patterned photoresist applied to an upper surface thereof. The pattern may simply comprise longitudinal slots for rendering the photoresist 23 alternately soluble and it may be seen that the soluble photoresist has been removed to provide exposure of the substrate 21 so that the slots 25 and 27 may be milled therein or formed by O.D.E. etching process. These slots 25 and 27 penetrate the upper surface of the silicon substrate 21 sufficiently deeply that they extend beneath the depth of the region which will ultimately become the active regions for the various transistors.

Figure 3:
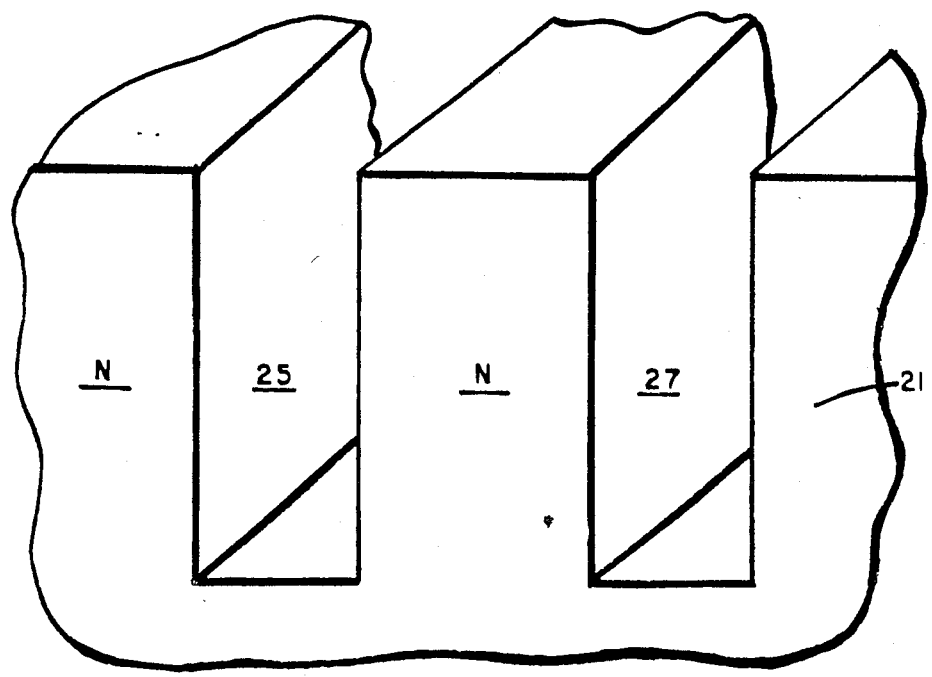
FIG. 3 is a perspective view of the substrate showing the first set of longitudinal slots.

In FIG. 3, the photoresist layer 23 has been removed and the structure is shown in perspective thereby showing the slots 25 and 27 extending inwardly of the upper surface of silicon substrate 21.

Figure 4:
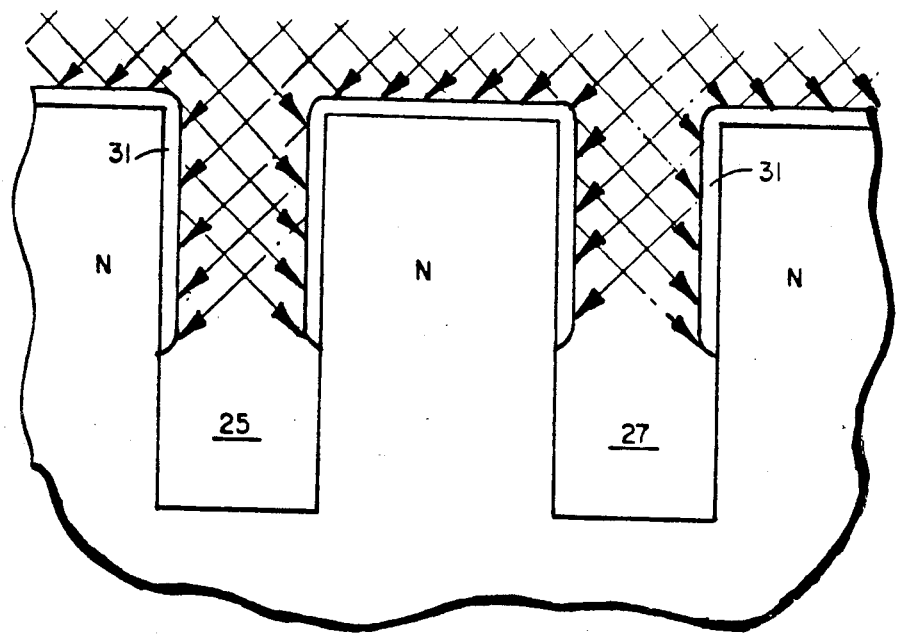
FIG. 4 is a view in section showing the application of an angle evaporation etch resist layer partially protecting the edges of the slots.
Figure 5:
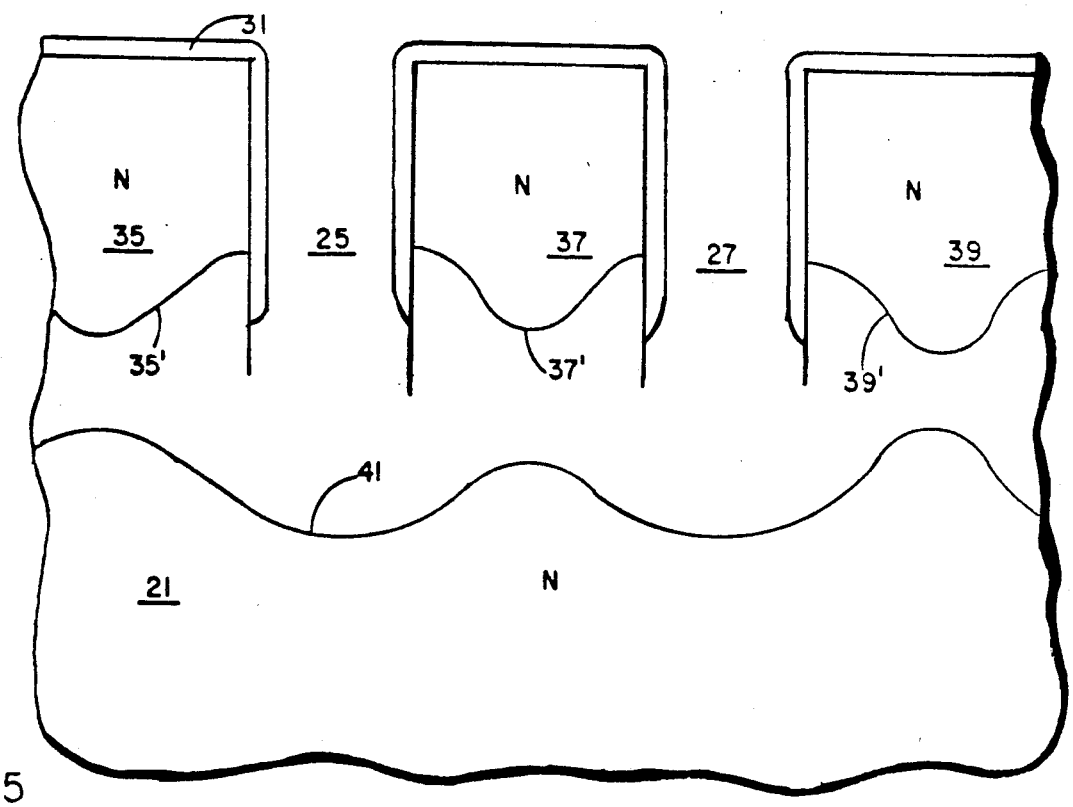
FIG. 5 is a view in section with the etch resist layer in place and showing the effects of the etch having been applied via the slots to undercut the longitudinal regions which will become active regions of the transistors being formed.

In FIG. 4 it may be appreciated why the slots 25 and 27 are necessary. They permit angle evaporation of etch-resist 31 to the edges of the slots 25 and 27. The result provides a protective covering over the tops of the active regions being formed. Also, it should be noted that due to the angle of evaporation of the etch resist 31, this protective layer only extends to a certain depth within slots 25 and 27, but this depth must be adequate to protect the active regions being formed. Thus, in FIG. 5, it may be seen that the active regions are generally shown at 35, 37 and 39 above the silicon substrate etch level 41 and also above the etch levels 35′, 37′ and 39′ where the etch introduced through the slots 25 and 27 removed the substrate from beneath the active regions 35, 37 and 39.

Actually, there are plurality of active regions aligned in the remaining portions 35, 37 and 39 which represent semi-arrays of transistors being formed. Obviously, the semi-arrays are supported at their ends or spaced apart positions so that the active regions do not collapse into the substrate etched space 41.

Figure 6:
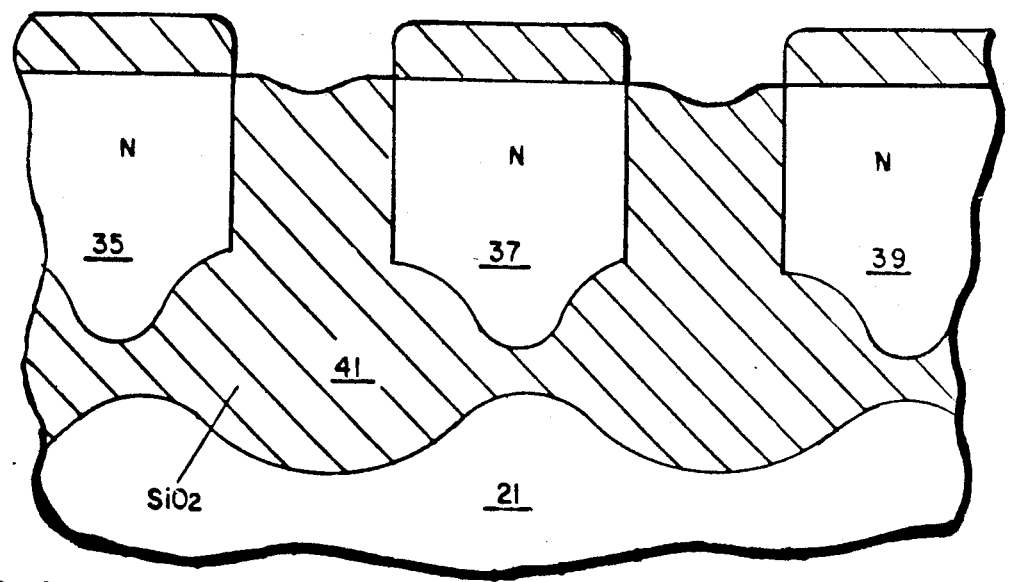
FIG. 6 shows the structure of FIG. 5 after the etch resist has been removed and following oxidation of the substrate to fill in the voids created by the etch.
Figure 7:
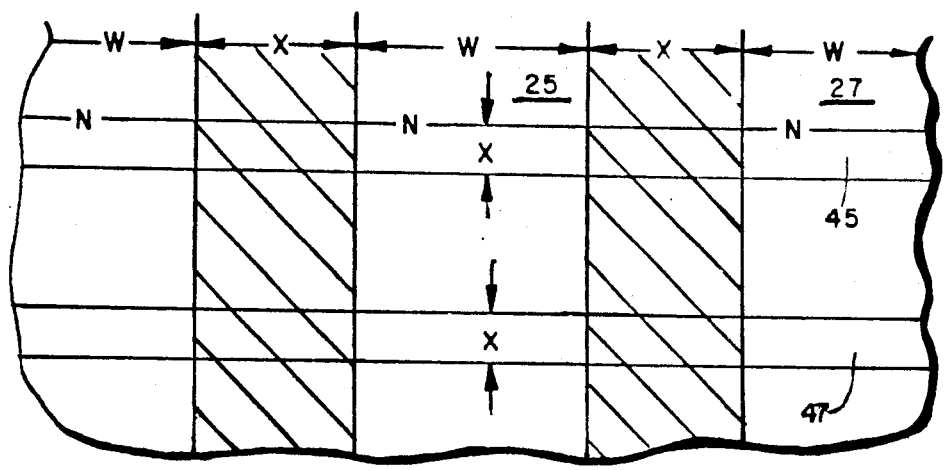
FIG. 7 is a view in plan of the structure of FIG. 6 showing the orthogonal set of slots relative to the original set of slots.

In FIG. 6 it may be seen that the etch resist 31 has been removed and the silicon has been oxidized to $SiO_2$ shown at 41 as filling or partly filling the voids between regions 35, 37 and 39 and the silicon substrate 21. Thus, with the regions supported now by the silicon oxide 41, the orthogonally related sets of slots 45 and 47 may be formed as illustrated in the top plan view of FIG. 7. The procedure for forming these slots is the same as before, requiring a photoresist layer patterned in the form of spaced apart slots and the silicon material either ion milled away or etched using O.D.E. techniques, as best shown in FIG. 8.

Figure 8:
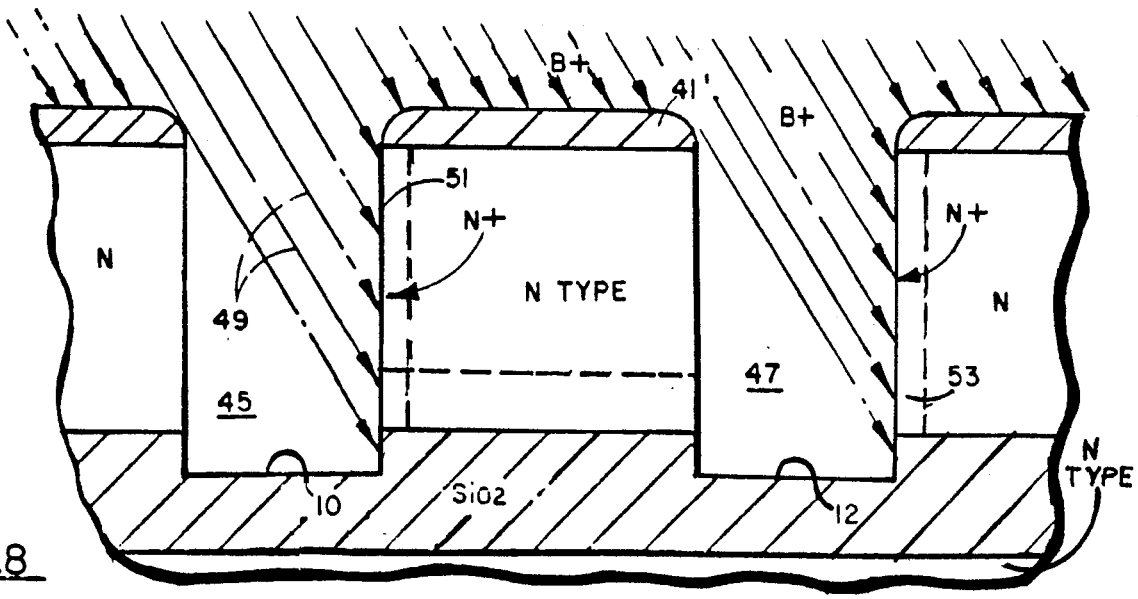
FIG. 8 is a view in section taken across the orthogonal set of slots showing the phosphorous ion implant step to produce the N+doping shown.

In FIG. 8 the application of N+ doping is achieved by phosphorous implant shown by the arrows 49 to produce the N+ region 51. It should be noted that this implanting is done only into the corresponding right hand edges of slots 45 and 47 to provide the N+ layers 51 and 53.

Figure 9:
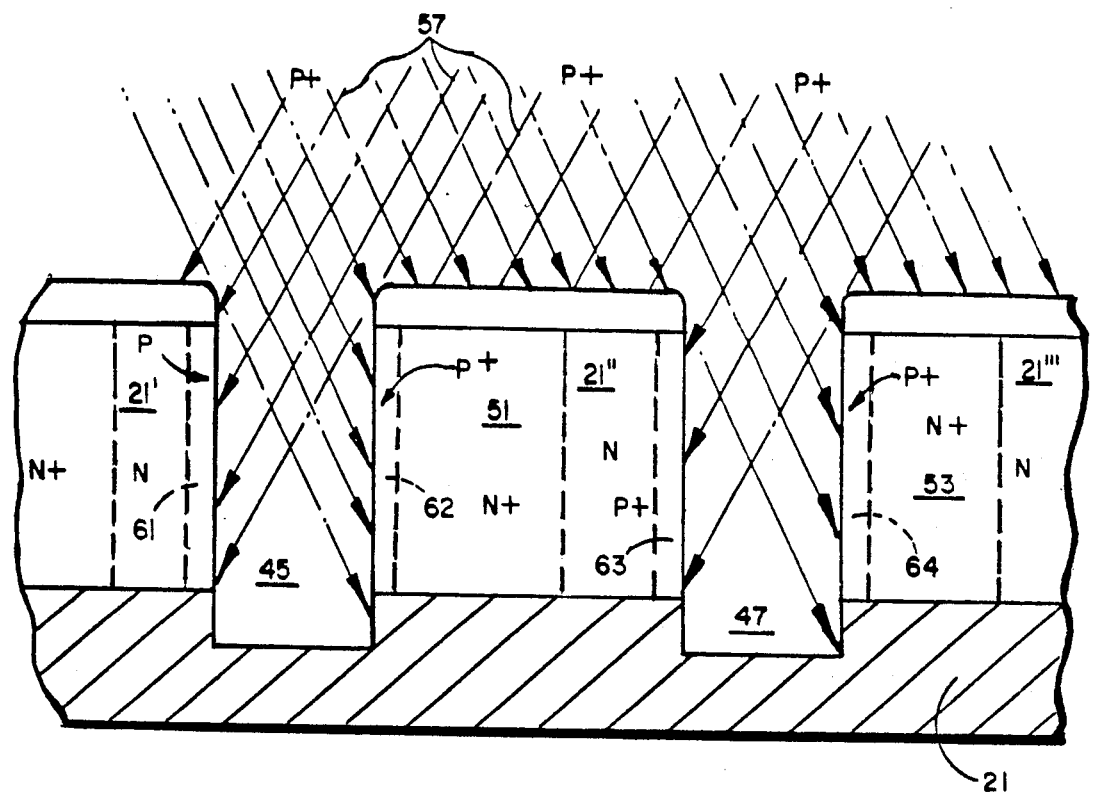
FIG. 9 shows the structure of FIG. 8 taken after phosphorous drive-in and the application of boron deposit or implant.

In FIG. 9 it may be seen that the N+ regions have been driven in, such as by using high heat so that they are expanded as shown by 51' and 53'. Also, a further N+ region is visible to the left at 55', having been produced by a slot to the left of the margin of the page.

Next in FIG. 9 it will be seen that boron is implanted (or deposited) into both edges of each slots as shown by the arrows 57 to provide the P or P+ regions 61, 62, 63 and 64. It may also be pointed out that the N regions 21', 21" and 21''' are the remaining regions from the original P type silicon substrate.

Figure 10:
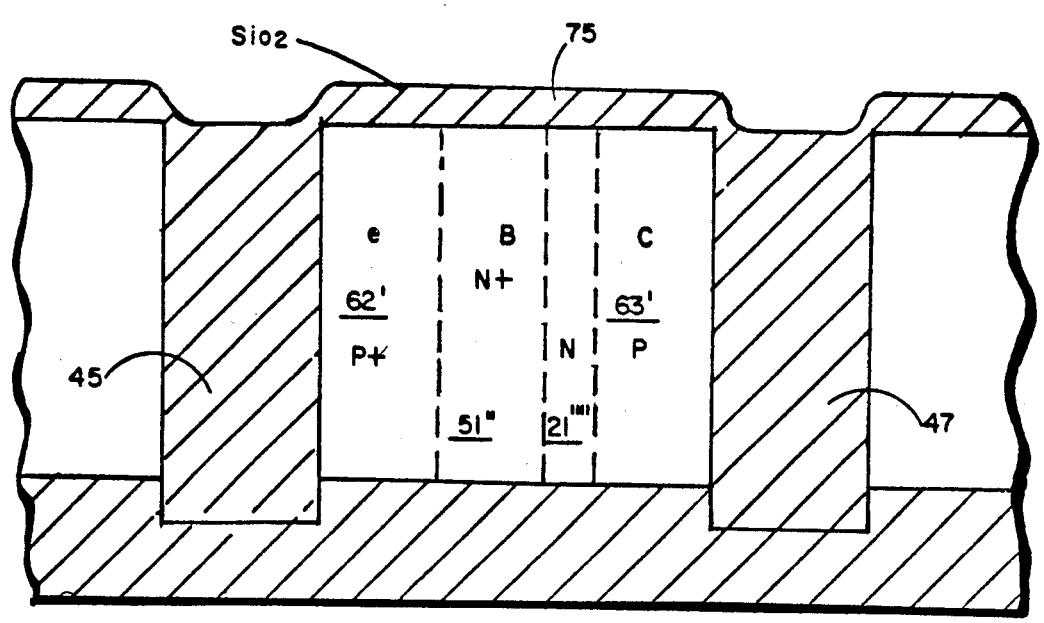
FIG. 10 shows the structure of FIG. 9 following boron drive-in from both sides to produce the P regions and following oxidation of the substrate to fill the slots and protect the top.

Proceeding from FIG. 9 to FIG. 10, it may be seen that the boron P or P+ regions 62 and 63 have now been driven in to comprise the expanded regions 62' and 63'. Accordingly, the N+ region has been changed in size and is now designated 51" as is also true of the remaining N region now identified as 21''''. The region 62' will comprise the emitter with the regions 51" and 21'''' comprising a graded base region and finally region 63' being the collector region.

Also, in FIG. 10 it may be seen that the substrate has again been oxidized to fill in the slots 45 and 47 and provide a covering over the active region of the electrodes generally shown at 75. The doping gradient in the base region is similar to convention double diffused transistors.

Figure 11:
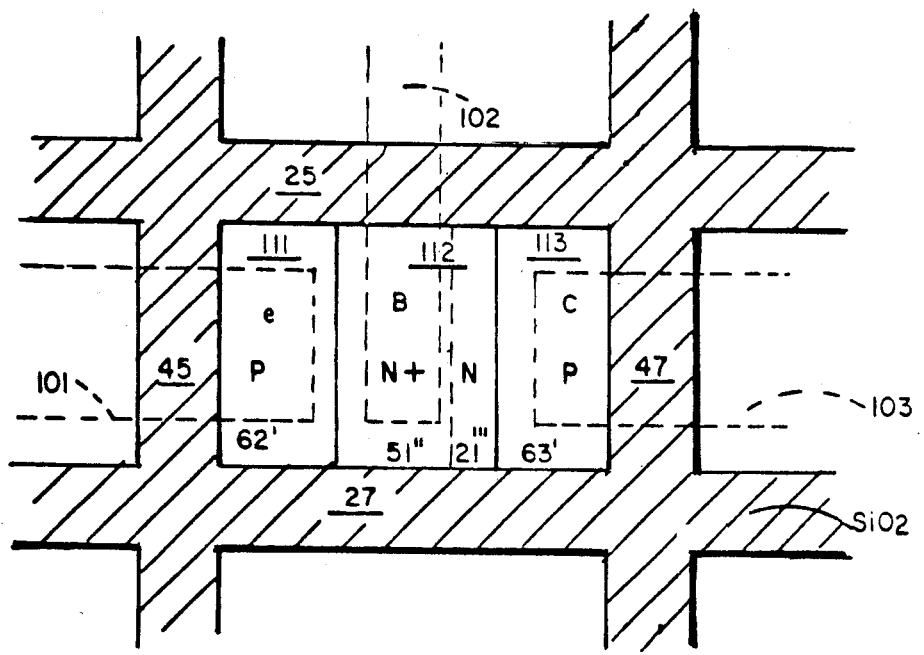
FIG. 11 is a top plan view of the completed structure showing in dashed outline the electrode connections for the emitter, base and collector for a single active region of a single transistor.

A finished transistor is shown in FIG. 11 wherein the contacts 101, 102 and 103 are provided from a metallization layer for the emitter 111, base 112 and collector 113, respectively. These contacts are fabricated simply by conventional techniques for patterning or metallization.

It may be seen that the transistor comprising these three electrodes is surrounded by moats of silicon oxide formed in the slots 25, 27 and 45 47. Thus, the transistor is isolated from its substrate, adjacent transistors or other elements.

Figure 12:
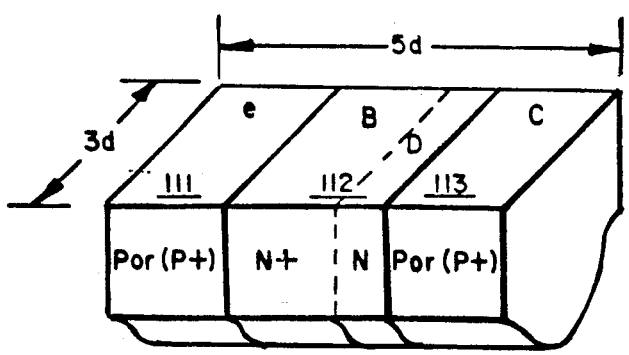
FIG. 12 is a view in perspective of the transistor active region, per se.

The active region of the transistor is visible in FIG. 12 in the perspective view showing the emitter 111 base 112 and collector 113.

Figure 13:
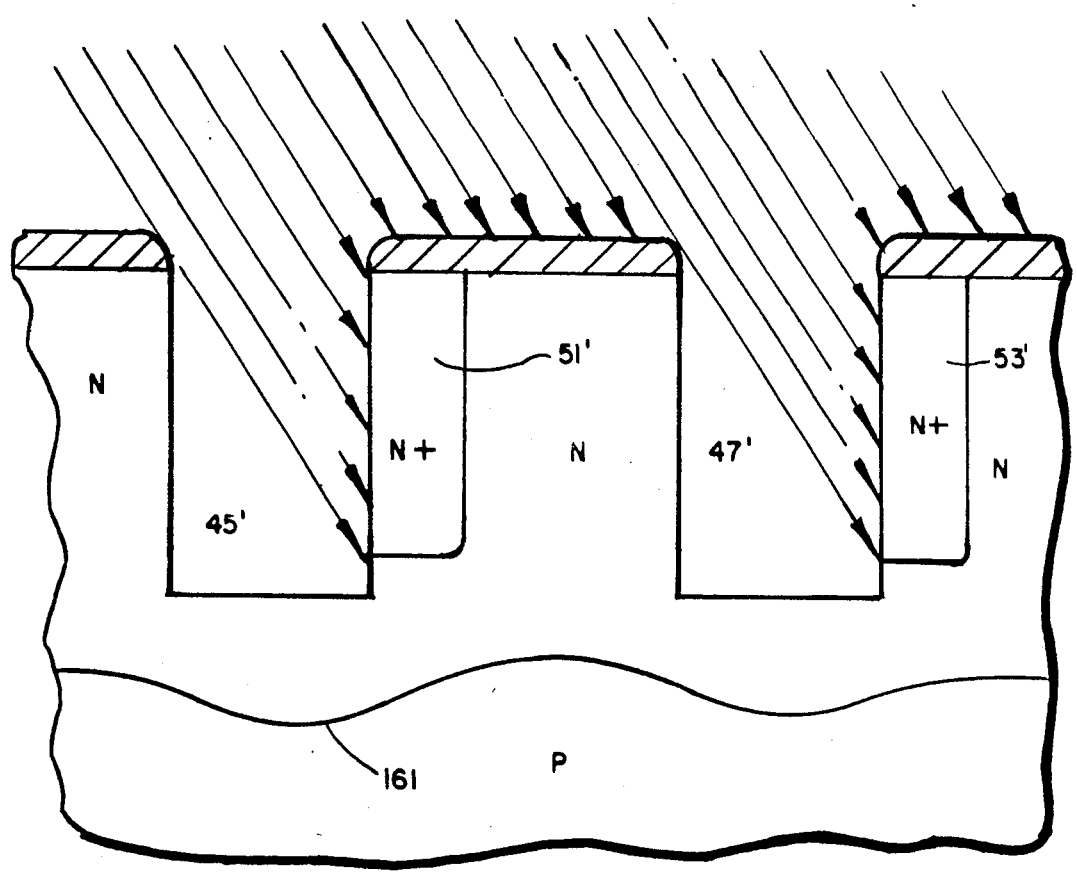
FIG. 13 shows an alternate embodiment using substrate doping change in lieu of oxide for device isolation; and, FIG. 14 shows you the steps of the process of FIG. 13.
Figure 14:
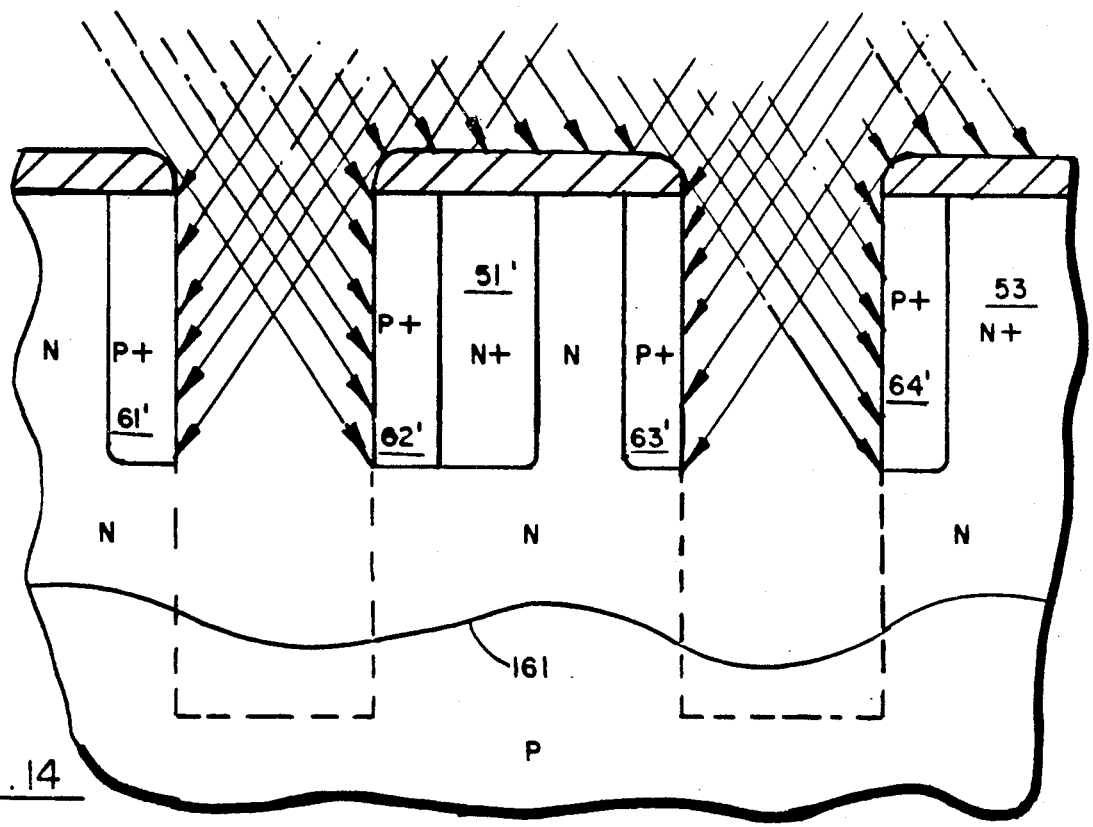

If it is desired to use doping opposite that of the substrate beneath the active region as further isolation, a P substrate can be doped N in the active regions and the use of O.D.E. avoided by skipping from FIG. 3 to FIG. 8. First, the active regions are doped N (see FIG. 13) via the slots 45 and 47; and next, phosphorus or arsenic is ion angle implanted so only regions 51', 53' become N+ doped. Then, boron is implanted from all edges of slots 45' and 47' (FIG. 14) to form P+ regions 61', 62', 63' and 64'. Thereafter, the slots 45' and 47' are deepened original P substrate and filled with oxide. Thus, each active region is P+N+N and P+doped in an N doped region but is underlaid by P doped substrate for total isolation without using etching techniques.

The principles of the present invention are compatible with use of the Perkin Elmer Projection Printer equipment for 2 micron dimensions, the 10:1 stepper for 1 micron rated dimensions, and electron beam or X-ray lithography for under 1 micron dimensions, even utilizing a portion of a line as a contact, all utilizing accepted existing registration and alignment techniques.

While modifications may readily appear to those skilled in the art, it is intended that the scope of the invention be defined in the appended claims, wherein:

What is claimed is:

1. A method for forming an array of VLSI dimensioned PNP-type lateral transistors on a substrate doped P-type, wherein each transistor is formed comprising the following steps:
   masking the substrate to outline a pair of boundary regions for each semi-array of active regions to comprise a transistor;
   slotting the substrate in said boundary regions to a given depth;
   angle evaporating etch resist to cover the active regions of the substrate and the edges of said slots to a depth above the given depth via the slotted boundary regions;
   etching away the substrate below said depth sufficiently to separate the semi-arrays of active regions from the substrate except at spaced apart locations therealong;
   removing the etch resist;
   oxidizing the substrate to fill in the portions etched away and the slots;
   slotting the substrate orthogonally to the first mentioned slots to provide second slots with orthogonal pairs of slots defining active regions for the respective transistors;
   doping the regions defined by orthogonal pairs of slots N+ via corresponding edges of the second slots and driving in the N+ doping;
   doping of said last mentioned regions via both edges of each slot P+ and driving in the P+ doping;
   oxidizing the substrate to completely isolate said active regions from the substrate; and,
   establishing electrical connections to the outer P+ regions and inner N+N region.

2. The method of claim 1, wherein: said slots are formed by one of ion milling and orientation dependent etching.

3. A method for forming an array of VLSI dimensioned PNP-type lateral transistors on a substrate doped P-type, wherein each transistor is formed comprising the following steps:
   masking the substrate to outline a pair of boundary regions for each semi-array of active regions to comprise a transistor;
   slotting the substrate in said boundary regions to a given depth;

oxidizing the substrate sufficiently at least to fill in the slots;

slotting the substrate orthogonally to the first mentioned slots to provide second slots with orthogonal pairs of slots defining active regions for the respective transistors;

N doping the active regions via orthogonal pairs of slots;

N+ doping portions of the active regions via one of each slot and driving in the N+ doping;

P+ doping portions of the active regions via both edges of each slot;

deepening the slots into the underlying P substrate;

oxidizing the substrate to completely fill the slots; and, establishing electrical connections to the outer P+ regions and inner N+N region.

* * * * *

UNITED STATES PATENT AND TRADEMARK OFFICE
CERTIFICATE OF CORRECTION

PATENT NO. : 4,580,331
DATED : April 8, 1986
INVENTOR(S) : Sidney I. Soclof

It is certified that error appears in the above-identified patent and that said Letters Patent are hereby corrected as shown below:

Column 4, lines 8 and 9, after the word "deepened" and before the word "original" please insert --into the--.

Signed and Sealed this

Nineteenth Day of August 1986

[SEAL]

Attest:

Attesting Officer

DONALD J. QUIGG

Commissioner of Patents and Trademarks